US009600608B2

(12) United States Patent
Poudret et al.

(10) Patent No.: US 9,600,608 B2
(45) Date of Patent: Mar. 21, 2017

(54) METHOD OF CONSTRUCTING A GEOLOGICAL MODEL COMPRISING SETTING A DEPOSITIONAL POSITION OF STRATIGRAPHIC UNITS

(75) Inventors: Mathieu Poudret, Paris (FR); Chakib Bennis, Rueil-Malmaison (FR); Jean-François Rainaud, Fourqueux (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 813 days.

(21) Appl. No.: 13/557,632

(22) Filed: Jul. 25, 2012

(65) Prior Publication Data

US 2013/0124161 A1    May 16, 2013

(30) Foreign Application Priority Data

Aug. 17, 2011    (FR) .................................... 11 02530

(51) Int. Cl.
 *G06F 17/50* (2006.01)
 *G01V 99/00* (2009.01)
(52) U.S. Cl.
 CPC ........ *G06F 17/5009* (2013.01); *G01V 99/005* (2013.01); *G01V 2210/642* (2013.01)
(58) Field of Classification Search
 None
 See application file for complete search history.

(56) References Cited

U.S. PATENT DOCUMENTS

| | | | | |
|---|---|---|---|---|
| 6,300,958 B1 * | 10/2001 | Mallet | ................... | G06T 15/04 345/442 |
| 7,248,259 B2 * | 7/2007 | Fremming | ................... | 345/420 |
| 7,523,024 B2 * | 4/2009 | Endres et al. | ................... | 703/6 |
| 8,315,845 B2 * | 11/2012 | Lepage | ................. | G01V 11/00 703/10 |
| 8,494,827 B2 * | 7/2013 | Mutlu | ..................... | G01V 9/00 703/10 |
| 8,600,708 B1 * | 12/2013 | Mallet et al. | ..................... | 703/2 |

(Continued)

OTHER PUBLICATIONS

Moretti, I, et al: "KINE3D: A New 3D Restoration Method Based on a Mixed Approach Linking Geometry and Geomechanics", Oil 7 Gas Science and Technology—Revue De L'Institut Francais Du Petrole, Editions Technip, Paris, FR, vol. 61, No. 2, Jan. 1, 2006 (Jan. 1, 2006), pp. 277-289, XP002583702, ISSN: 0020-2274.

(Continued)

*Primary Examiner* — Kibrom K Gebresilassie
(74) *Attorney, Agent, or Firm* — Fitch, Even, Tabin & Flannery LLP

(57) ABSTRACT

Method of constructing a geological for setting a depositional position of a stratigraphic unit. A depositional position of the stratigraphic unit is set with respect to a reference surface, to define a depositional space. The stratigraphic unit in depositional position is then calibrated to superimpose it on the initial stratigraphic unit. The wells are then positioned in this depositional space. A regular Cartesian grid is superimposed on the stratigraphic unit with a depositional position which is filled with property values characterizing the underground formation modelled by a geostatistical simulation. The values assigned to the cells of the grid are transferred to the cells of the stratigraphic mesh.

47 Claims, 9 Drawing Sheets

(56) References Cited

U.S. PATENT DOCUMENTS

| | | | |
|---|---|---|---|
| 8,674,984 B2* | 3/2014 | Ran | G06T 17/205 345/419 |
| 8,711,140 B1* | 4/2014 | Mallet | 345/419 |
| 8,743,115 B1* | 6/2014 | Mallet et al. | 345/424 |
| 8,776,895 B2* | 7/2014 | Li et al. | 166/369 |
| 8,798,974 B1* | 8/2014 | Nunns | 703/6 |
| 2002/0091502 A1 | 7/2002 | Malthe-Sorenssen et al. | |
| 2003/0216897 A1* | 11/2003 | Endres et al. | 703/10 |
| 2006/0235666 A1* | 10/2006 | Assa et al. | 703/10 |
| 2008/0243454 A1* | 10/2008 | Mallet | 703/6 |
| 2009/0248374 A1* | 10/2009 | Huang | E21B 43/00 703/2 |
| 2010/0017181 A1* | 1/2010 | Mouton et al. | 703/9 |
| 2011/0015910 A1* | 1/2011 | Ran et al. | 703/2 |
| 2011/0077918 A1* | 3/2011 | Mutlu | G01V 9/00 703/2 |
| 2011/0106507 A1* | 5/2011 | Lepage | 703/2 |
| 2012/0022837 A1* | 1/2012 | Asbury et al. | 703/2 |
| 2012/0026167 A1* | 2/2012 | Ran et al. | 345/420 |
| 2012/0029827 A1* | 2/2012 | Pepper et al. | 702/16 |
| 2012/0265510 A1* | 10/2012 | Lepage | G01V 99/005 703/9 |
| 2013/0124161 A1* | 5/2013 | Poudret | G01V 99/005 703/2 |
| 2013/0218539 A1* | 8/2013 | Souche | G01V 99/005 703/2 |
| 2013/0332125 A1* | 12/2013 | Suter et al. | 703/6 |
| 2014/0136171 A1* | 5/2014 | Sword et al. | 703/10 |
| 2015/0293260 A1* | 10/2015 | Ghayour | G01V 99/005 703/2 |

OTHER PUBLICATIONS

Moretti, et al: "Working in Complex Areas: New Restoration Workflow Based on Quality Control, 2D and 3D Restorations", Marine and Petroleum Geology, Butterworth Scientific, Guildford, GB., vol. 5, No. 3, Feb. 18, 2008 (Feb. 18, 2008), pp. 205-218, XP022489005, ISSN: 0264-8172, DOI: 10.1016/J. Marpetgeo. 2007.07.001.

* cited by examiner

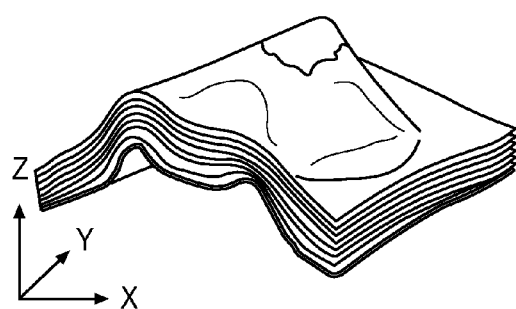
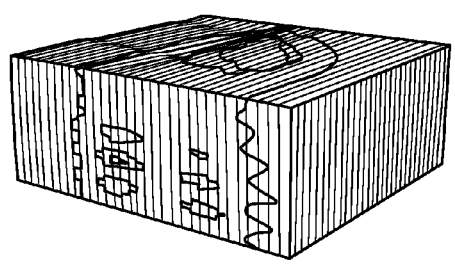
FIG. 2A          FIG. 2B
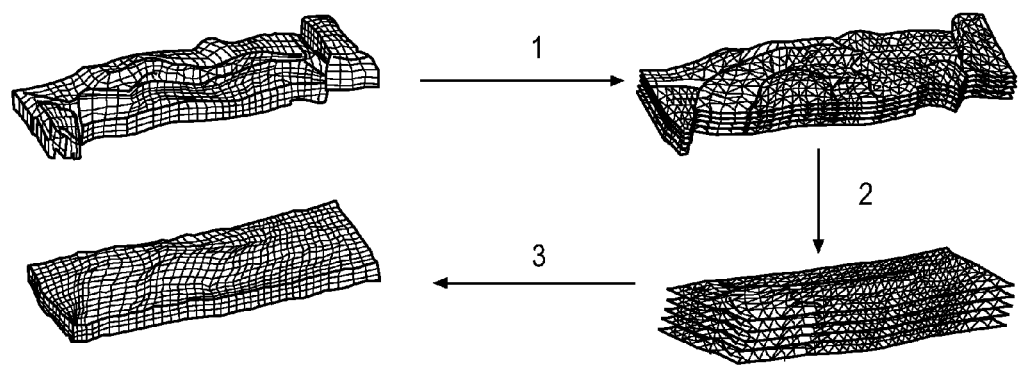
FIG. 3

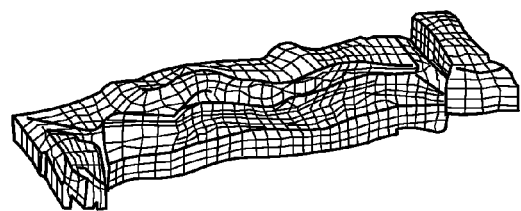
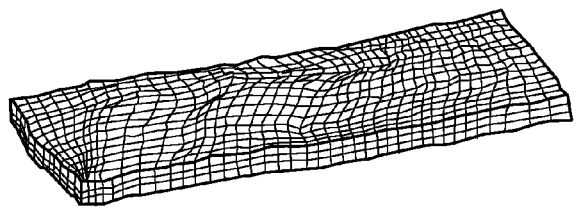
FIG. 10A  FIG. 10B
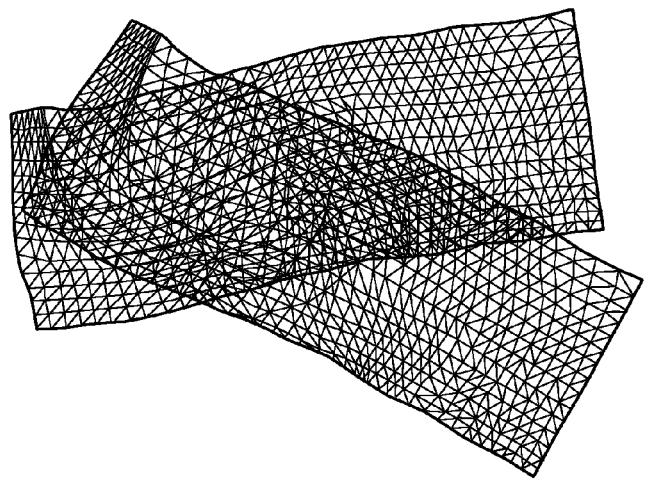
FIG. 11

METHOD OF CONSTRUCTING A GEOLOGICAL MODEL COMPRISING SETTING A DEPOSITIONAL POSITION OF STRATIGRAPHIC UNITS

CROSS REFERENCE TO RELATED APPLICATION

Reference is made to French Patent Application Serial No. 11/02.530, filed on Aug. 17, 2011, which application is incorporated herein by reference in its entirety.

BACKGROUND OF THE INVENTION

Field of the Invention

The present invention relates to the petroleum industry and to the development of underground formations such as petroleum reservoirs, gas storage sites or basins and in particular, the invention allows construction of an image of the underground formation referred to as "geological mode" or updating an image to provide coherency with the various data collected in the field.

Optimization and development of underground formations is based on the most accurate possible description of the structure, the petrophysical properties, the fluid properties, etc., of the formation being studied. A geological model is used to account approximately for these aspects. The model of the subsoil is representative of both its structure and its behaviour. Generally, this type of model is represented in a computer and is then described as a numerical model. Geological models comprise a mesh or grid, generally three-dimensional which is associated with one or more petrophysical property maps (porosity, permeability, saturation, etc.). The association assigns values of the petrophysical properties to each cell of the mesh. Thus, a geological model represented in a computer is a N-dimensional grid (N>0 and generally equal to two or three). Each cell is assigned the value of a property characteristic of the zone being studied. It can be, for example, the porosity or the permeability distributed in a reservoir.

These well-known models are widely used in the petroleum industry and allow determination of many technical parameters relative to the study or the development of a reservoir such as, for example, a hydrocarbon reservoir. In fact, since the geological model is representative of the structure of the reservoir and of the behavior thereof, engineers use it for example to determine which zones are the most likely to contain hydrocarbons, the zones in which it can be either interesting or necessary to drill an injection or a production well in order to enhance hydrocarbon recovery, the type of tools to use, the properties of the fluids used and recovered, etc. These interpretations of reservoir models in terms of "technical development parameters" are well known, although new methods are regularly developed. Similarly, modelling $CO_2$ storage sites allows monitoring these sites to detect abnormal behaviors and to predict the displacement of the $CO_2$ that is injected.

Geological formations are generally very heterogeneous media comprising deformed sedimentary surfaces which are cut and offset by faults. The meshes of the geological model are therefore very complex objects comprising deformed cells comprising sedimentary surfaces defining stratigraphic units which are cut or deformed by faults. Such complexity is generally represented by meshes referred to as "stratigraphic meshes".

To construct the geological model, this stratigraphic mesh then has to be filled with properties characteristic of the underground formation. Geostatistical simulations whose principles are discussed hereafter are thus used.

The value of a property characteristic of the zone under study is referred to as "regionalized variable" which is a continuous variable, distributed in space, which is representative of a physical phenomenon. From a mathematical point of view, it is simply a function $z(u)$ with a value at each point u (the cell of the grid) of a field of study D (the grid representative of the reservoir). However, the variation of the regionalized variable (RV) in this space is too irregular to be expressed by a mathematical equation. In fact, the regionalized variable represented by $z(u)$ has both a global aspect, relative to the spatial structure of the phenomenon being studied, and a random local aspect.

The latter random local aspect can be modelled by a random variable(RV). A random variable is a variable that can take a certain number of realizations z according to a given probability law. Continuous variables such as seismic attributes (acoustic impedance) or petrophysical properties (saturation, porosity, permeability) can be modelled by RVs. Thus, at point u, the regionalized variable $z(u)$ can be considered to be the realization of a random variable Z.

However, in order to properly represent the spatial variability of the regionalized variable, the double aspect, random and structured, has to be taken into account. One possible approach, of probabilistic type, involves the notion of random function. A random function (RF) is a set of random variables (RV) defined in a field of study D (the grid representative of the reservoir), that is $\{Z(u), u*D\}$, denoted $Z(u)$. Thus, any group of sampled values $\{z(u1), \ldots, z(un)\}$ can be considered to be a particular realization of the random function $Z(u)=\{Z(u1), \ldots, Z(un)\}$. RV $Z(u)$ which allows taking into account both the locally random aspect (at $u^*$, the regionalized variable $z(u^*)$ being a RV and the structured aspect (via the spatial probability law associated with the RF $Z(u)$).

The realizations of a random function associated with a mesh provide stochastic geological models. From such models, it is possible to appreciate the way the underground zone works under study. For example, simulation of the flows in a porous medium represented by numerical stochastic models allows, among other things, prediction of the reservoir production permitting optimizing its development by testing various scenarios.

However, it is very difficult to carry out geostatistical simulations on stratigraphic meshes that are nevertheless the best tools for properly representing the complex geometry of an underground formation. In fact, these methods are based on an estimation of distances, and notably the estimation of variograms. Now, it is very difficult to perform such an estimation on a stratigraphic mesh.

There are various methods for filling a stratigraphic mesh using geostatistical simulation.

For example, a first method defines, in a geographical space at the "current" time, a non-Cartesian regular 3D grid (I,J,K) with a vertical sampling equivalent to the sampling of the property measurements along the drilling trajectories (fine stratigraphic mesh) and having the specific feature of resting the K=Constant surfaces on a reference surface (roof of the reservoir, base of the reservoir or any surface). These methods then make up a geostatistical computational space by defining a Cartesian grid having the same number of cells as the fine stratigraphic mesh for which the cell dimensions are equal to the mean of the dimensions of the cells of the fine stratigraphic mesh. It is on this grid that the geostatistical filling operations are achieved.

However, this method is sensitive to the choices made for making up the stratigraphic mesh, which can lead to distortions that are harmful to the quality of the results obtained. Notably, these methods do not allow precise estimation of distances for defining a variogram which is an essential tool for geostatistical simulations.

Other methods, referred to as "implicit", allow global filling of a stratigraphic mesh. The principle of the implicit approach is to construct a 3D function F=f(x, y, z) so that a geological interface is defined as a particular isovalue surface F0 of function F. The model is not stored explicitly in the form of pixels or voxels and is made explicit by querying "on the fly" in order to know in which formation is any point (x, y, z). This "query" is not re-sampling of the model from a discretized image. It is an exact calculation of the model at the point being considered. However, these implicit methods require entire reconstruction of the model. These techniques are for example described in the following documents:

Lajaunie, Ch. et al., 1997, "Foliation Fields and 3d Cartography in Geology: Principles of a Method Based on Potential Interpolation", Mathematical Geology, 29 (4), 571-584, Calcagno, P. et al., 2008, "Geological Modelling from Field Data and Geological Knowledge—Part I. Modelling Method Coupling 3D Potential Field Interpolation and Geological Rules.", Physics of the Earth and Planetary Interiors, Vol. 171, No. 1-4, pp. 147-157, Mallet, J. L., 2004, "Space-Time Mathematical Framework for Sedimentary Geology.", Mathematical Geology 36, N.1, Dulac J. C., 2009, "Advances in Chrono-Stratigraphic Interpretation Modelling", First Break Volume 27, Patent Applications WO2005/119304 and WO2003/050766.

SUMMARY OF THE INVENTION

Thus, the invention is an alternative method for constructing a geological model representative of an underground formation. The method overcomes the problems of prior methods by setting a depositional position of a reference surface belonging to a stratigraphic unit, then by calibrating the surfaces in a depositional position with respect to their reference surface. Geostatistical simulations can then be performed so as to fill this unit with a property characteristic of the formation.

The method according to the invention allows updating only part of the geological model (a single stratigraphic unit) without having to estimate the properties for the entire stratigraphic mesh.

Furthermore, the method provides increased precision in the estimation of distances for defining the variogram, an essential tool for geostatistical simulations.

In general terms, the invention is a method for constructing an image of an underground formation traversed by at least one well with the image comprising a stratigraphic mesh including at least one stratigraphic unit defined by an upper surface and a lower surface which represents a homogeneous sedimentary layer. The stratigraphic unit comprising a set of cells with each cell defined by a set of nodes. At least one property characteristic of the formation is measured at the level of the well. The method comprises the following stages:

i. setting a depositional position of the stratigraphic unit, by determining a position of the cell nodes of the unit at a time of deposition of at least one reference surface contained in the stratigraphic unit, by carrying out the following stages:

a. performing an isometric unfolding of at least the reference surface;

b. defining a rotation and a translation to be applied to the unfolded surface by a minimization of distances between a set of points of the reference surface and corresponding points in the unfolded surface, and applying the rotation and the translation to the unfolded surface to obtain a superimposition of the unfolded surface with the reference surface;

c. using the superimposition to achieve visual control of a setting of a depositional position and then applying an identical unfolding within the stratigraphic unit;

ii. superimposing a regular Cartesian grid on the stratigraphic unit set in depositional position;

iii. assigning a value of the property characteristic of the formation to each cell of the grid, from the well measurement, the well set in the depositional position and a geostatistical simulation; and iv. transferring the values assigned to the grid cells to the cells of the stratigraphic mesh.

According to the invention, the set of points of the reference surface can be selected by selecting vertices of the reference surface with each vertex not being on a fault or in an eroded region.

The unfolded reference surface can be positioned in a three-dimensional space by calculating an average depth of a set of vertices of the reference surface, and by assigning to the set of vertices of the unfolded surface the average depth.

According to an embodiment, setting a depositional position of the stratigraphic unit is achieved by an isometric unfolding of two reference surfaces, followed by a calibration of each unfolded surface with respect to the corresponding reference surface and by a second calibration through rotation and translation of the two unfolded reference surfaces with respect to one another, and a proportional unfolding of surfaces contained between the two reference surfaces. The two reference surfaces can correspond to the upper surface and the lower surface.

According to this embodiment, the second calibration can be performed by defining the rotation and the translation to be applied to a first unfolded surface by a minimization of distances between a set of points of the first unfolded surface and corresponding points in said the second unfolded surface. The rotation and the translation are applied to the first unfolded surface to obtain a superimposition of the unfolded surfaces.

According to the invention, an isometric unfolding can be performed by taking faults of the formation into account and by carrying out a fault side closure.

Finally, according to the invention, the surfaces can be triangulated surfaces.

BRIEF DESCRIPTION OF THE DRAWINGS

Other features and advantages of the method according to the invention will be clear from reading the description hereafter of embodiments given by way of non limitative examples, with reference to the accompanying figures wherein:

FIG. 2A illustrates a stratigraphic mesh in the geographic reference frame (x, y, z);

FIG. 2B illustrates a regular Cartesian mesh corresponding to the setting of a depositional position of the stratigraphic mesh of FIG. 2A;

FIG. 3 illustrates the method of setting a depositional position through vertical projection;

FIG. 10 illustrates the isometric unfolding of the stratigraphic mesh (left) leading to the depositional space (right) according to the method using isometric unfolding from a reference surface;

FIG. 11 illustrates the fact that the unfolded surfaces resulting from the method of laying surfaces flat are not in the same reference frame'

DETAILED DESCRIPTION OF THE INVENTION

The method according to the invention allows construction or updating of a geological model (image of an underground formation) representative of an underground formation traversed by at least one well.

From this well, at least one property characteristic of the formation is measured along the well trajectory. This measured information measured along the well trajectory is then extended to an entire stratigraphic mesh. This mesh and this information in each cell make up an image of an underground formation referred to as geological model.

Figure 1:
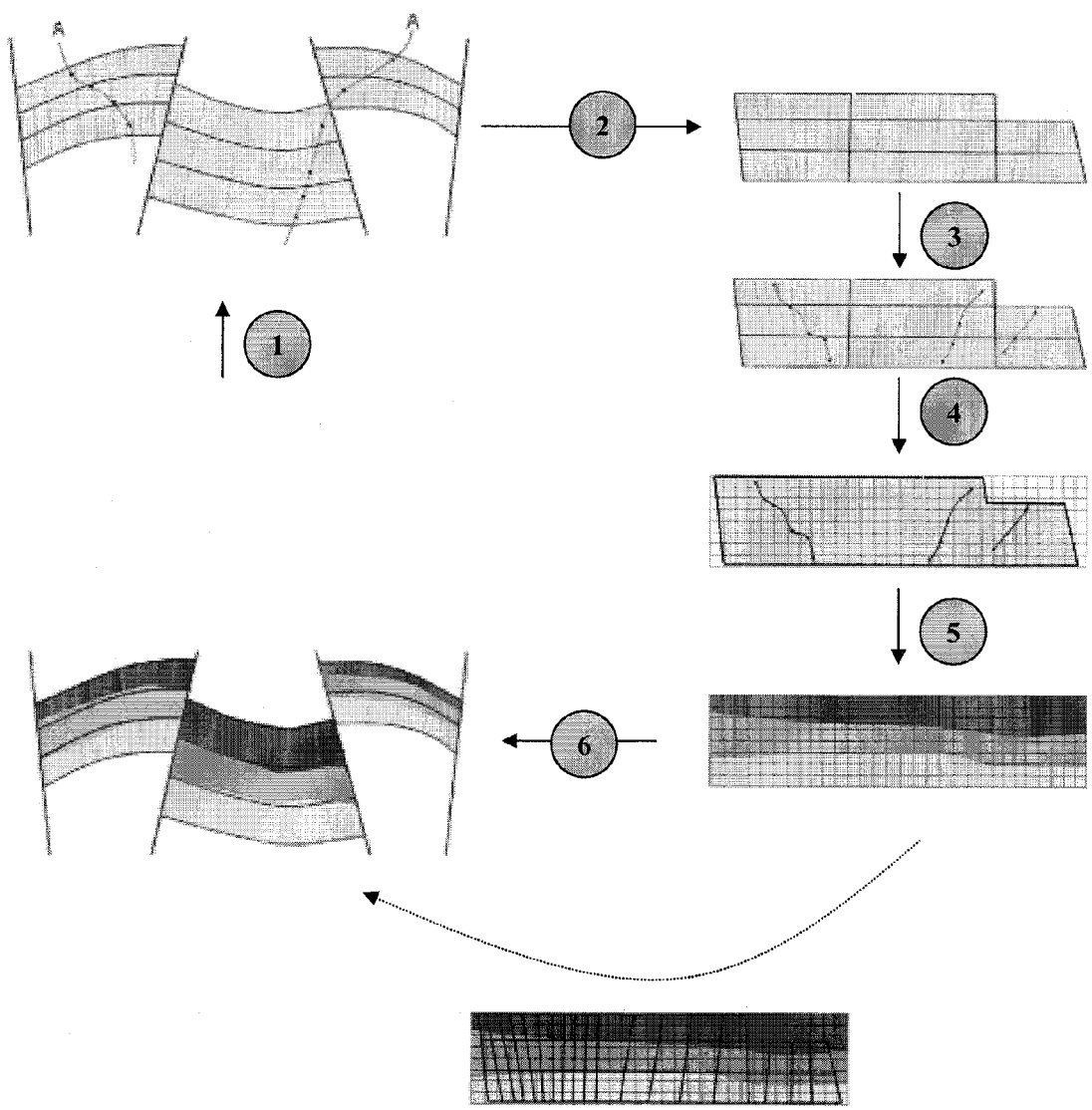
FIG. 1 illustrates the stages of the method according to the invention.

FIG. 1 illustrates the stages of the method according to the invention after acquiring measurements along the trajectory of a well:
1. Construction of at least one stratigraphic unit
2. Setting a depositional position of the stratigraphic unit and calibration with respect to the original stratigraphic unit 3. Setting a depositional position of the well trajectory
4. Superimposition of a regular Cartesian grid
5. Filling of the regular Cartesian grid by geostatistical simulation
6. Transfer of the properties from the Cartesian grid to the stratigraphic mesh.

1—Construction of at Least One Stratigraphic Unit

A stratigraphic mesh discretizing the underground formation and representative of the structure (sedimentary layers layout, faults, etc.) of this formation at the present time is constructed. This stratigraphic mesh is defined in an orthonormal reference frame (x, y, z) referred to as the "geographic reference frame". Thus, each cell of the stratigraphic mesh is identified, at the current time, by geographic coordinates x, y and z (depths). Thus, the stratigraphic unit comprises a set of cells with each cell being defined by a set of nodes.

The stratigraphic mesh divides the underground formation into a set of stratigraphic units defined by the interval between two sedimentary surfaces referred to as horizons. Thus, the image of the formation comprises a stratigraphic mesh including at least one stratigraphic unit defined by an upper surface and a lower surface and representing a homogeneous sedimentary layer.

Construction of such a stratigraphic mesh is well known. FIG. 2A illustrates such a mesh in the geographic reference frame (x, y, z).

The next stages, 2 to 7, are carried out for at least one stratigraphic unit. Indeed, according to the invention, advantageously each stratigraphic unit can be worked. Of course, in order to fill the entire geological model, each stage (2 to 7) is repeated for all the stratigraphic units of the geological model.

2—Setting a Depositional Position of the Stratigraphic Unit and Calibration of the Unfolded Surface with Respect to the Reference Surface Assigning to each cell a property characteristic of the formation, such as porosity, permeability, etc., is referred to as filling. This stage is carried out by a geostatistical simulator which is software from data measured in the formation are logs, seismic, and data. This type of simulator is more efficient and reliable when used on regular Cartesian grids.

Setting a depositional position of the stratigraphic mesh is achieved to construct this mesh. This stage assigns to each point identified by coordinates at the current time coordinates at a prior time with the time corresponding to the deposition of the stratigraphic unit under study. It thus "deforms" the horizons contained in the unit in depositional position (prior to deformation in the course of the sedimentary and tectonic history). This amounts to restoring the underground formation, that is looking backward over its tectonic history (folding, fault slips).

According to the invention, the history is not reconstructed incrementally to progressively go backward from the current state to the initial paleogeographic state. Instead points characteristic of the formation are transported in a single stage (marker at the roof, at the base along a well trajectory, positions of the measuring points sampled by the logs). It sets a depositional position of the stratigraphic unit by determining a position of the nodes and centers of cells forming the unit at the time of deposition.

FIG. 2B illustrates the result of a setting of depositional position of the stratigraphic mesh of FIG. 2A.

To carry out this stage, the method according to the invention independently uses two alternatives which are either setting the depositional position by a vertical projection or setting the depositional position by an isometric unfolding.

2.1—Setting a Depositional Position of at Least One Stratigraphic Unit Through Vertical Projection FIG. 3 illustrates the method used. It comprises the following stages:
i) Extraction and triangulation of all the surfaces contained in the unit;
ii) Vertical projection in a 2D plane of all the surfaces; and
iii) Construction of the depositional space from the obtained plane surfaces.

This method allows calculation of a setting in depositional position of a stratigraphic mesh using vertical projections. The input data of this algorithm are: a reference surface (selected by the user), a set of faults and a set of points to be brought into a depositional position. The algorithm provides the set of points in depositional position.

First of all, the input data must meet the following hypotheses:
The surface from which the points of the stratigraphic mesh are set in depositional position is called the reference surface and is denoted by S,
Faults $F_1, \ldots, F_i$ are cut through volumes within the stratigraphic mesh which are also triangulated surfaces;
Each geological formation can have several connected volumes (the faults can disconnect the volumes).
What is referred to as a "geological space" (EG) is the space defined by the stratigraphic mesh, that is the stratigraphic unit prior to setting a depositional position.
What is referred to as a "depositional space" (ED) is the stratigraphic unit after setting a depositional position.

Figure 6:
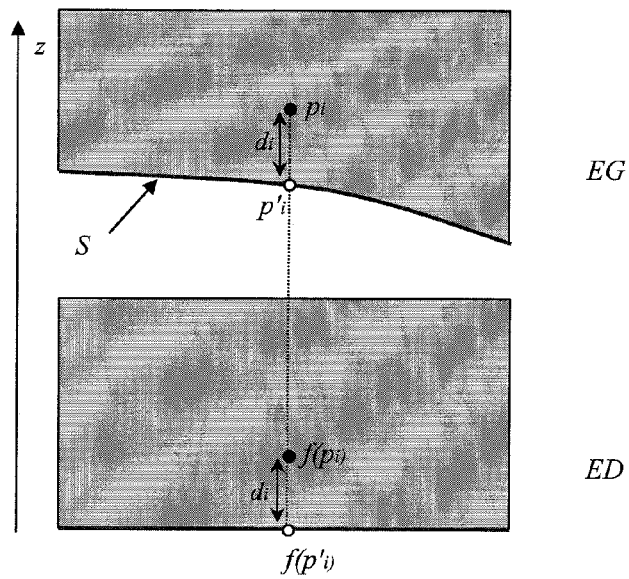
FIG. 6 illustrates the vertical projection of a point $p_i$ of the geological space (EG), and the calculation of its position in the depositional space (ED) as a function of the reference surface (SR)

A plane orthogonal to the z-axis is selected (in the following detailed description of the algorithm, by selecting z=0). Each point $p_i=(x_i, y_i, z_i)$ of a geological space is projected vertically (along the z-axis) on reference surface S (FIG. 6). $P'_i$ is the projection of $p_i$ onto S and $d_i$ which is the length of segment $[p_i, p'_i]$. The image of point $p_i$ in the depositional space is defined by $f(p_i)=(x_i, y_i, z_i)$. FIG. 6 illustrates the vertical projection of a point $p_i$ of the geological space (EG) and the calculation of its position in depositional space (ED) as a function of reference surface (S).

According to an embodiment, the presence of faults is managed by problems which may arise locally around faults when they prevent projection of $p_i$ onto S. $p_i$ are then said to be located in an uncertainty region.

A point p of a geological space is in an uncertainty region if and only if there is no point q∈S meeting the following two conditions:
Q is on the vertical projection line of p (that is p and q have the same coordinates at x and y); and
segment [p,q] intersects no fault.

For the points located in an uncertainty region having at least one vertical projection on S, the following solution allows providing the neighborhood properties between the points of the geological space and the points of the depositional space:

Let $p_i=(x_i, y_i, d_i)$ be a point of an uncertainty region and we associate with $p_i$ a point $p'_i$ where $p'_i$ is the point at the edge of S that is the closest to $p_i$ such that segment $[p_i, p'_i]$ intersects no fault. The plane tangent to S at point $p'_i$ is calculated (it is denoted by $T(S, p'_i)$). Point $p_i$ is then projected vertically onto $T(S, p'_i)$ at a point $t_i=(xt_i, yt_i, zt_i)$. Let $d_i$ be the length of segment $[p_i, t_i]$. The image of point $p_i$ in the depositional space is then defined by $f(p_i)=(x_i, y_i, d_i)$ where $x_i=xt_i$ and $y_i=yt_i$.

According to another embodiment, possible numerical precision problems are managed as follows. The input data (horizons and faults) can involve imprecision problems that can be due to numerical precision problems or related to the data themselves. For example, data sets can comprise points of a horizon that can "go over the edge" to the other side of a fault. In this case, they are on the wrong side of the fault, and its projection calculation will therefore be altered. After determining point p' at the edge of S, the closest at x,y to point p to be deposited, it is then determined that no fault intersects segment [p,p']. In practice, a point p" is calculated from p'. This point p" is calculated from the barycenters of the triangles incident to p'. Point p" is thus point p' "offset towards the inside of the surface". Errors linked with numerical precision are then avoided. In practice, a preprocessing is performed at all vertices of the edge of the reference surface in order to contract this surface.

2.2—Setting a Depositional Position of at Least One Stratigraphic Unit Through Isometric Unfolding The principle of isometric unfolding is from a folded 3D surface, an unfolded surface (i.e. 2D) with minimum deformations is constructed. The criterion selected for minimizing the deformation is the elastic strain tensor.

Figure 7:
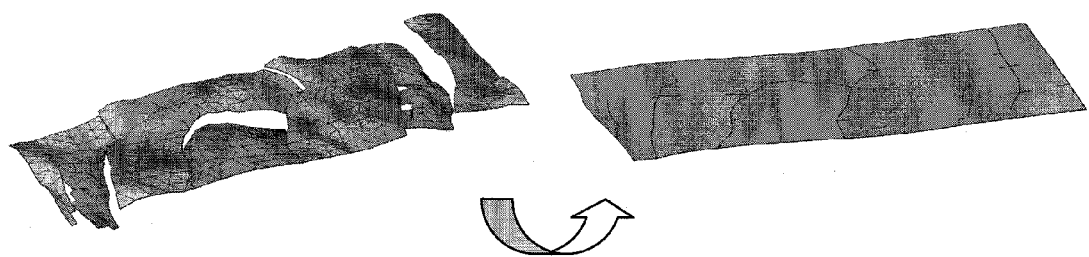
FIG. 7 illustrates the result of the isometric unfolding of a surface.

During deformation, all of the "Z" components are calculated to obtain a plane surface. At the level of the faults, the two sides are matched and smoothed to "plug" the holes at this level. The node matching information at the level of the fault sides is therefore kept during the surface extraction operation. FIG. 7 illustrates the result of the isometric unfolding of a surface.

One or two reference surfaces can be used to carry out this stage.

For this type of method, it must be possible to associate the nodes of the grid with each vertex of reference surface SR. This matching is directly obtained by a pillar-based structure of the stratigraphic mesh. This mesh type is well known.

Isometric Unfolding of a Single Reference Surface

Figure 4:
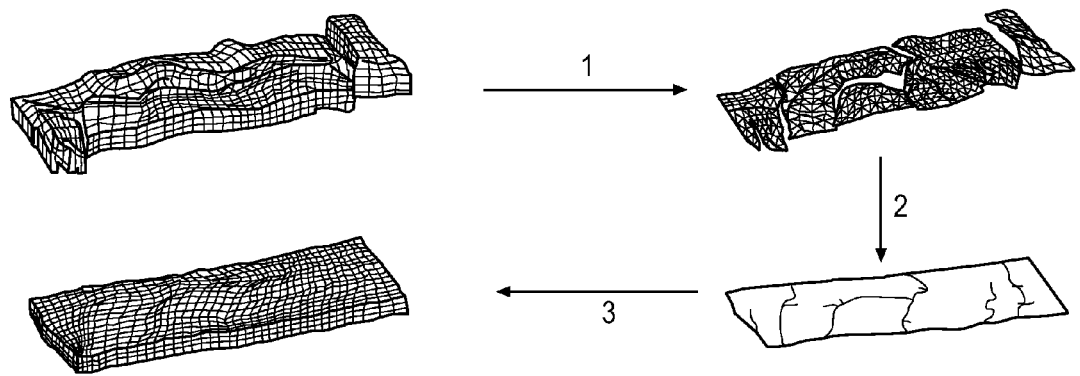
FIG. 4 illustrates the method of setting a depositional position through isometric unfolding from a reference surface.

FIG. 4 illustrates the method of isometric unfolding from a reference surface. According to this method, a reference surface is unfolded and then an identical deformation is applied to each surface of the stratigraphic unit processed. It comprises the following stages:
i) extraction and triangulation of a reference surface selected by the user;
ii) isometric unfolding of the reference surface;
iii) construction of the depositional space as a function of the deformation calculated upon unfolding of the reference surface by deformation of the horizons selected, calculated as a function of the deformation of the surface performed upon isometric unfolding.

From the flattening of a reference surface selected by the user, the horizons contained between the base and the roof which is selected are "straightened". Each point of SR (isometrically unfolded reference surface) is therefore associated with its corresponding pillar in the stratigraphic mesh. The deformation calculated for each point of SR is then applied along these pillars.

Applying this method involves matching between the reference surface and each pillar of the mesh. It is therefore necessary to ensure that each pillar strictly corresponds to a point of the reference surface. Therefore: (i) the sides of the faults must coincide correctly (that is no hole); (ii) the edge removal for simplifying the triangular mesh must not lead to no information.

The algorithm involves various stages developed hereafter:

Matching between the points of the triangulated reference surface and the nodes of the horizon of the mesh, and for each point P of the reference surface:
  calculation of the transformation T at P (folded surface to flat surface), and
  application of T to all the nodes of the pillar passing through P.

Matching of the Reference Surface and of the Mesh

In order to apply a deformation to each node of the mesh identical to that achieved upon the isometric unfolding of reference surface (SR), matching between the points of SR and the points of the grid is performed.

Thus, each vertex of SR is associated with a pillar of the mesh. However, several vertices can correspond to the same pillar of the mesh. Indeed, for a given horizon, a discontinuity can appear at the level of the faults. This discontinuity generates several vertices of a single node of the mesh having different coordinates.

Each point of SR is distinct and if one single node is referenced by several vertices, the vertices are treated independently. However, these vertices require a particular treatment to not produce discontinuities in the flattened grid. This treatment is described in detail in the next section.

During triangulation of the reference surface, some vertices are removed to not construct zero-sized triangles. Removal of these vertices implies that certain pillars of the mesh have no corresponding point in the reference surface. This removal is generated by the proximity of two vertices of the mesh belonging to the same face (or cell). To define the matching at these points, the retained vertex having equal coordinates is sought in the mesh. It belongs to the same cell as the removed vertex.

Isometric unfolding of the reference surface does not guarantee that the unfolded surface is in the same reference frame as the reference surface. It is therefore necessary to check that these two surfaces are indeed superimposed at the end of the unfolding operation and, if not, to perform a calibration of the unfolded surface with respect to the reference surface.

Calibration of the Unfolded Surface and Visual Control of the Quality of Setting a Depositional Position The unfolded surface is calibrated with respect to the corresponding folded surface (reference surface). The stratigraphic unit in depositional position is thus superimposed on the corresponding unit in geographic position. It is thus possible to assess visually (or automatically using image analysis softwares) the quality of the depositional position setting of the stratigraphic unit and of the wells associated therewith.

Figure 16A:
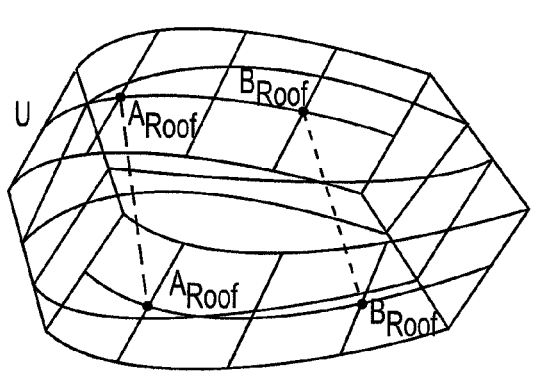
FIG. 16A illustrates a stratigraphic unit U, in geographic position.

Consider stratigraphic unit U in geographic position in FIG. 16A. In the reference surface of U, a set E of vertices is selected meeting criterion C2 so that the vertex is not located on a fault and it is not located in an eroded region. In practice, about ten vertices are enough. The reference surface can be either the lower surface of the unit, if a depositional position parallel to the lower surface (base of the unit) is desired or it may be the upper surface of the unit if a depositional position parallel to the upper surface (roof of the unit) is desired.

SE is the subset of vertices corresponding to E in the unfolded surface. To achieve calibration, it is desired to minimize the distances between a set of points of the unfolded surface and the corresponding points in the reference surface. A distance gap minimization algorithm is therefore applied with the set of reference vertices E and the set of vertices to be calibrated SE as the parameters. The minimization calculation is carried out in 2D with only the 2D coordinates of the vertices of E and SE being transmitted for calculation. An angle A and a translation T are obtained. An example of a gap minimization algorithm is described in the appendix.

The transformation of angle A (with respect to the origin of the 2D reference frame) and of translation T is applied to all the vertices of the reference surface.

The last stage places the unfolded reference surface in the 3D space. The average depth Zmoy of the vertices of the reference surface of U meeting the following criterion C1 is calculated. The vertex is not located on a fault and it is not located in an eroded region.

Depth Zmoy is then assigned to all the vertices of the unfolded surface. The unfolded surface is then calibrated with its corresponding surface in the geographic space.

Figure 17:
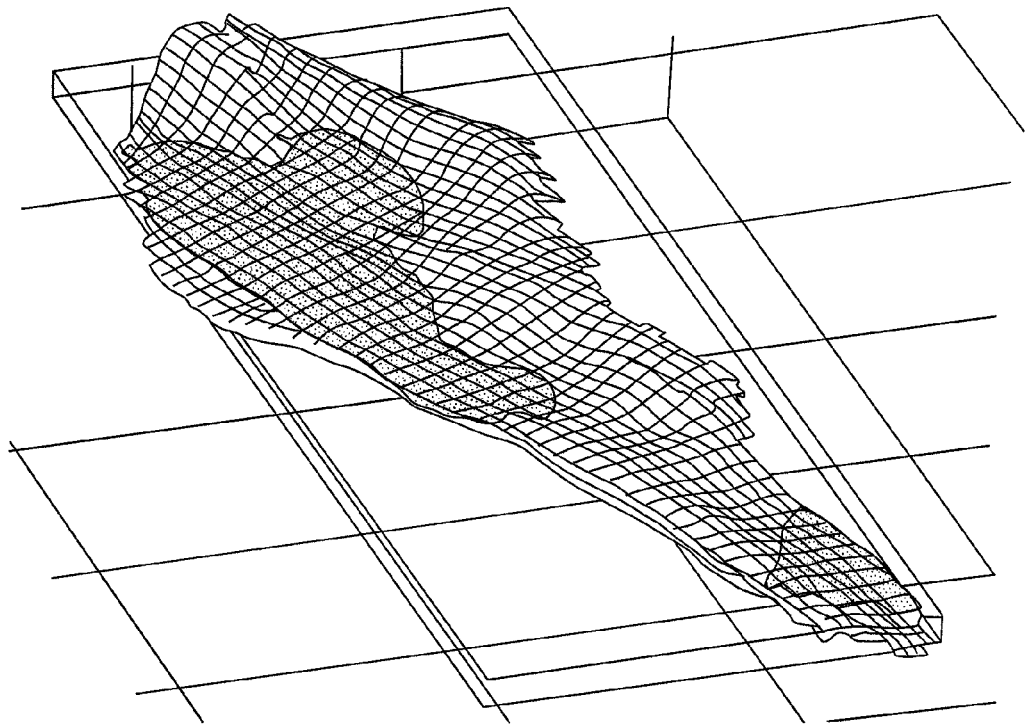
FIG. 17 illustrates the superimposition, after calibration, of a stratigraphic unit in geographic position and of this unit in depositional position in the same space.

Calibration through minimization thus allows positioning of a stratigraphic unit in geographic position and the corresponding unit in depositional position in the same space. Thus a "physical" matching is obtained that allows visual assessment of the quality of setting a depositional position, as illustrated in FIG. 17, where the unit in geographic position is shown in black and the corresponding unit in depositional position is shown in grey.

Calculation of the Transformation at Point P

In order to treat without exception all of the vertices constructed when flattening SR, the corresponding pillars of the mesh of the surface are treated iteratively (and not all the nodes of the mesh).

For each vertex of SR, two orthonormal bases are calculated. One is with respect to the unfolded surface and the other is with respect to the folded surface.

Figure 8:
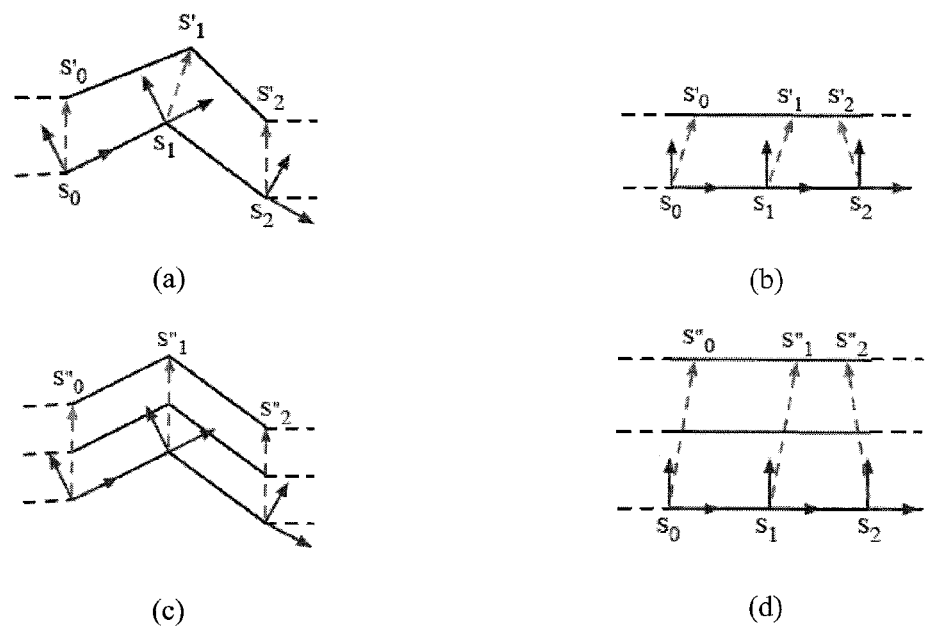
FIG. 8 illustrates the unfolding of three horizons contained in a grid.

From the bases that are produced, a transformation through base change allows, for each point of a horizon of the grid, a determination of the new position thereof. FIG. 8 illustrates the unfolding of three horizons contained in a grid. In this example, the reference surface selected is surface 0, and the horizons from 0 to 2 inclusive are unfolded.

Surface Discontinuity

Figure 9:
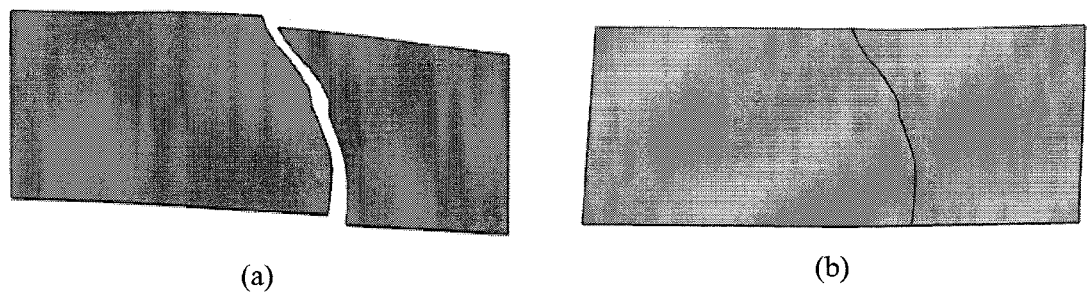
FIG. 9 illustrates the matching of the two sides of each fault when flattening a surface.

As explained in the previous section, the presence of faults generates discontinuities in the image of the surfaces. Thus, several vertices of SR can correspond to the same nodes (i,j) of the grid. In the surface flattening method, the two sides of each fault are adjusted so as to have good matching as illustrated in FIG. 9. Upon flattening, the sides of the faults are matched to not produce holes in the unfolded surface.

This discontinuity involves different normals Z1 and Z2 at the level of vertices S1 and S2 of the fault. To overcome this problem, a new normal is calculated for each pair of vertices of the edge of the fault, such that Z is the mean of Z1 and Z2. The normals used at S1 and S2 are equal and the transformations that are applied are equivalent. Thus, the resulting points S'1 and S'2 have the same coordinates X, Y. It is then possible to either leave the surface unfolded, or to calculate new points S"1 and S"2 by interpolation of S'1 and S'2.

FIG. 10 illustrates the isometric unfolding of the stratigraphic mesh (left) leading to the depositional space (right) according to the isometric unfolding method from a reference surface.

Isometric Unfolding of Two Reference Surfaces

Figure 5:
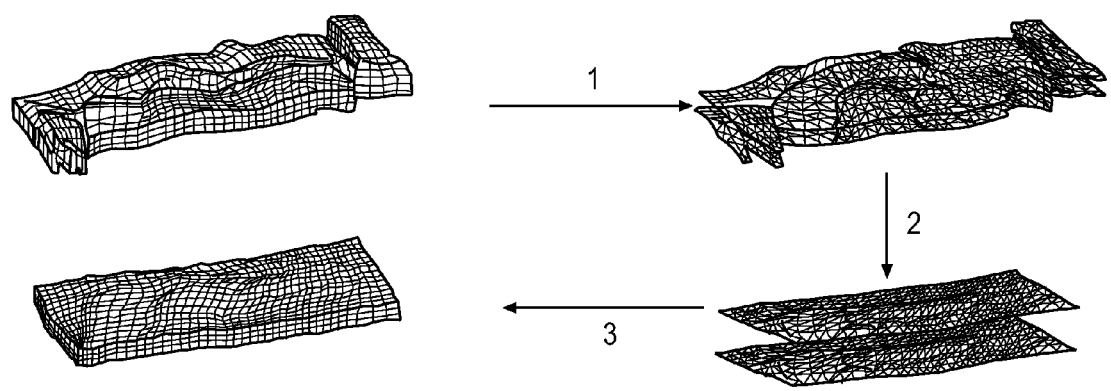
FIG. 5 illustrates the method of setting a depositional position through isometric unfolding from two reference surfaces.

FIG. 5 illustrates the isometric and proportional unfolding method from two reference surfaces. It comprises the following stages:
i) Extraction and triangulation of the upper and lower surfaces are selected by the user;

ii) Isometric unfolding and calibration of the two surfaces are performed in the same reference frame; and iii) Construction of the depositional space is performed by interpolation of the points along pillars of the stratigraphic mesh between the two reference surfaces.

From the flattening of the upper (Sroof) and lower (Sbase) surfaces, the positions of the surfaces contained between these surfaces are calculated by interpolation. Sbase and Sroof therefore have to be positioned in the same reference frame (which is not guaranteed by the flattening algorithm). Construction of the depositional space thus comprises two stages developed hereafter:

calibration of the upper (Sroof) and lower (Sbase) surfaces, and calculation by interpolation of the points of the grid between Sbase and Sroof.

Surface Calibration

The unfolded surfaces resulting from the flattening method are not in the same reference frame as illustrated in FIG. 11. It is necessary to carry out calibration to reposition them in relation to one another.

First Embodiment

To calibrate the two surfaces, their position in the folded space is calculated to replace the unfolded surfaces in a similar way. Each face is deformed independently during isometric unfolding and a reference cell has to be selected to achieve calibration. The unfolding process is performed from the face that contains the barycenter of the surface. This cell is the starting point of the process and it undergoes no deformation. The position of Sbase and of Sroof with respect to one another is therefore calculated from this cell.

Figure 12:
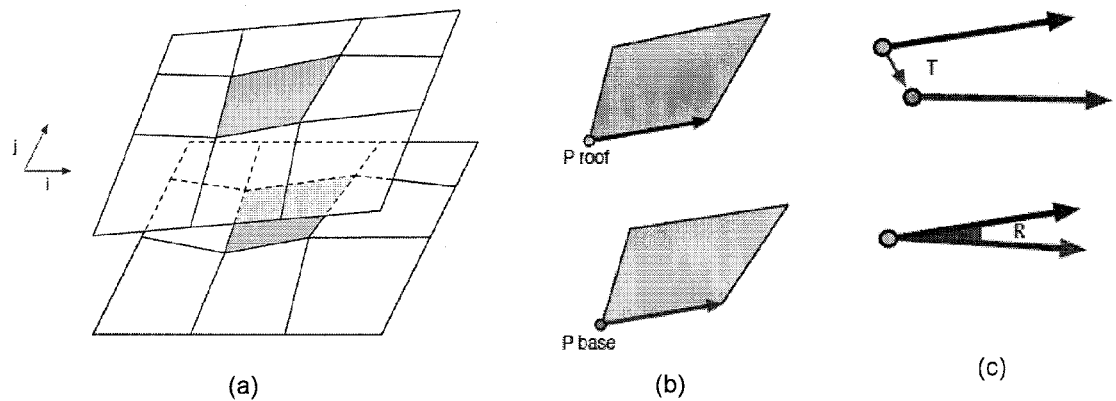
FIG. 12 explains the principle of reference surfaces calibration.

FIG. 12 explains the calculation of the position of the reference cell of Sbase with respect to the reference cell of Sroof: (a) the reference cells are selected at the level of the barycenter of the surfaces; (b) for each cell, a point and a vector are defined to calculate the position; and (c) through projection in a 2D plane, a translation T and a rotation R are calculated. Thus, two cells (i,j) are extracted, one from Sbase and the other from Sroof. The position of these two faces is defined from the calculation of a translation and of a rotation calculated in a 2D projection plane (x,y) (see FIG. 12).

Once the translation and the rotation is known, each point of surface Sroof (arbitrarily selected) is shifted according to the same transformation. An the points are therefore first repositioned so that Pbase and Proof (see FIG. 12) are superimposed. A transformation T and R is then applied.

To use this method, the two reference cells selected must exist in the two surfaces. This configuration can occur in two cases: (i) the barycenters of the surfaces are not contained in the same cell and one of them does not exist; and (ii) an erosion is observed in one of the surfaces. In both cases, a new reference cell address has to be selected with the deformation criterion thereof having to be a minimum.

Second Embodiment

The unfolded upper surface is first calibrated with respect to the unfolded lower surface. Therefore it is desirable to minimize the distances between a set of points of the unfolded base and the corresponding points in the unfolded roof. During this process, it is desirable to determine that the angles existing in the initial stratigraphic unit (in geographic position) between the roof, the base and the "coordlines" of the units are maintained. The depositional position setting algorithm is therefore used on a punctual basis on a single reference surface. The "coordlines" are the vertical lines that make up the skeleton of the grid modelling the unit. Then, in order to minimize the error produced by the calibration, the process is repeated by choosing this time to calibrate the unfolded base surface with respect to the folded roof.

The calibration is described in detail according to stages 1 to 6 as follows:

1. Consider stratigraphic unit U, in geographic position, of FIG. 16A. On the base of U, a subset of vertices is selected meeting criteria C1 that a vertex is not located on a fault and is not located in an eroded region and there is a corresponding vertex on the roof of the unit. In practice, about ten vertices are enough. For reasons of clarity, in the example of FIG. 16A, only vertices $A_{Base}$ and $B_{Base}$ are selected. $A_{Toit}$ and $B_{Toit}$ are respectively the vertices corresponding to $A_{Base}$ and $B_{Base}$ on the roof of the unit.

Figure 16B:
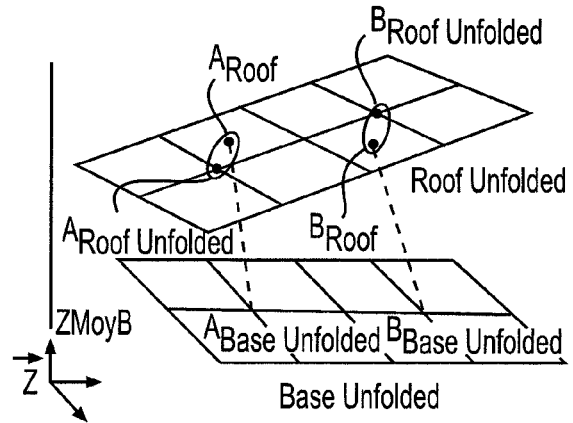
FIG. 16B illustrates the roof and the base of stratigraphic unit U, in unfolded position.

2. BaseDépliée and ToitDéplié are the unfolded 2D surfaces of the base and of the roof of unit U (see FIG. 16B). It is chosen to calibrate surface ToitDéplié with respect to surface BaseDépliée. Let $A_{BaseDépliée}$ and $B_{BaseDépliée}$ are respectively the vertices of BaseDépliée corresponding to $A_{Base}$ and $B_{Base}$. The depositional position setting algorithm based on the unfolding of a reference surface is used in order to reposition vertices $A_{Toit}$ and $B_{Toit}$ in the unfolded space. Vertices $A_{Toit}'$ and $B_{Toit}'$ are respectively obtained.

3. $A_{ToitDéplié}$ and $B_{ToitDéplié}$ are respectively the vertices of surface ToitDéplié corresponding to $A_{Toit}$ and $B_{Toit}$. The gap minimization algorithm defined in the Appendix is applied, as the parameter with all the reference vertices $A_{Toit}'$ and $B_{Toit}'$ and all the vertices are to be calibrated $A_{ToitDéplié}$ and $B_{ToitDéplié}$. The minimization calculation is carried out in 2D with only the 2D coordinates of $A_{Toit}'$, $B_{Toit}'$, $A_{ToitDéplié}$ and $B_{ToitDéplié}$ being transmitted for calculation. An angle A and a translation T are obtained.

4. The transformation of angle A (with respect to the origin of the 2D reference frame) and of translation T is applied to all the vertices of surface ToitDéplié. Surfaces BaseDépliée and ToitDéplié are now calibrated with respect to one another in the 2D space.

5. Stages 1 to 4 are repeated by taking in stage 1 all of the initial vertices ($A_{Base}$ and $B_{Base}$) on the roof of the unit and all of the corresponding vertices $A_{Toit}$ and $B_{Toit}$ on the base of the unit. Surface BaseDépliée is thus calibrated with respect to surface ToitDéplié. This repetition of stages 1 to 4 ensures minimization of the error induced by the calibration algorithm.

6. Surfaces BaseDépliée and ToitDéplié (now 2D calibrated) are then placed in the 3D depositional space. The average depth ZMoyB of all the vertices of the base of U meeting criterion C1 is calculated. The average depth ZMoyT of all the vertices of the roof of U meeting criterion C1 is then calculated. Values z ZMoyB and ZMoyT are then respectively assigned to all the vertices of surfaces BaseDépliée and ToitDéplié.

Calibration of the Unfolded Base Surface for Visual Control of the Quality of Setting a Depositional Position The method of calibrating the unfolded lower surface with respect to the folded lower surface and of the unfolded upper surface with respect to the folded upper surface, is the same as the method used for calibrating the reference surface and is described within the context of the isometric unfolding of a single reference surface ("Calibration of the unfolded surface and visual control of the quality of setting a depositional position").

Calculation of the Grid Through Interpolation

Proportional unfolding constructs the entire depositional space by a calculation of proportional interpolation of the surfaces contained between the upper and lower reference surfaces which are selected.

For each point of the surfaces, the vector connecting Pbase to Proof is therefore calculated, then divided into N intervals, thus creating the N points corresponding to the N horizons contained between surfaces Sbase and Sroof.

The main advantage of the method lies in the fault management. Indeed, the sides thereof are determined upon isometric unfolding of Sbase and Sroof and it is not necessary to perform any particular treatments during the construction of the depositional space.

For each of the previous methods, the following technique can be used for extraction and triangulation of the surfaces.

The user isolates within the pillar-structured (I, J, K) stratigraphic mesh a stratigraphic unit between two values of K: K TOP and K BOTTOM. This unit is then also represented by a pillar-based stratigraphic mesh.

The user selects within this submesh a horizon as the reference surface between K TOP and K BOTTOM. This horizon is represented by all the points of the reservoir mesh having the same value for K for all I and J, which defines a surface.

All the faces corresponding to this surface are extracted from the mesh in order to produce the reference surface. The surface is then triangulated to be used for the flattening algorithms.

Extraction of the horizons from a pillar-structured (I, J, K) stratigraphic mesh is carried out in two stages. First, for a horizon (layer k of a grid) and a direction (that is upper or lower faces), a face matrix whose size corresponds to the number of cells for the unit considered is constructed. It contains the points of the future triangulated mesh. A correction is then made to the point of the triangulated surface whose topology is incorrect.

Construction of the Face Matrix

For the desired direction, this matrix contains the faces of each cell of the stratigraphic unit. The interest lies in the fact that each face of the matrix contains the references on the 4 points incident thereto. Thus, face TOP (resp. BOTTOM) of a cell of the mesh contains 4 vertex indices numbered in logical order.

The vertices of the surface are generated from a path of the nodes incident to faces TOP (resp. BOTTOM) of the cells of layer k of the grid. The vertices of each node are visited in a circular manner. Each time a vertex of the grid is visited, its curvilinear abscissa is compared with the previous vertex. If it is different, the vertex visited generates a new vertex in the surface.

If all the vertices of the node have the same curvilinear coordinate, these vertices belong to the same vertex of the surface that is generated.

It is important to unfold surfaces that are manifold surfaces (that is if two faces are incident to the same vertex, but not incident to the same edge). To generate manifold surfaces, specific treatments have to be applied at the level of nodes having several connected components with incident faces. The correction must be brought on the face matrix prior to the generation of the triangulated surface, to guarantee correct fault detection thereafter.

Figure 13:
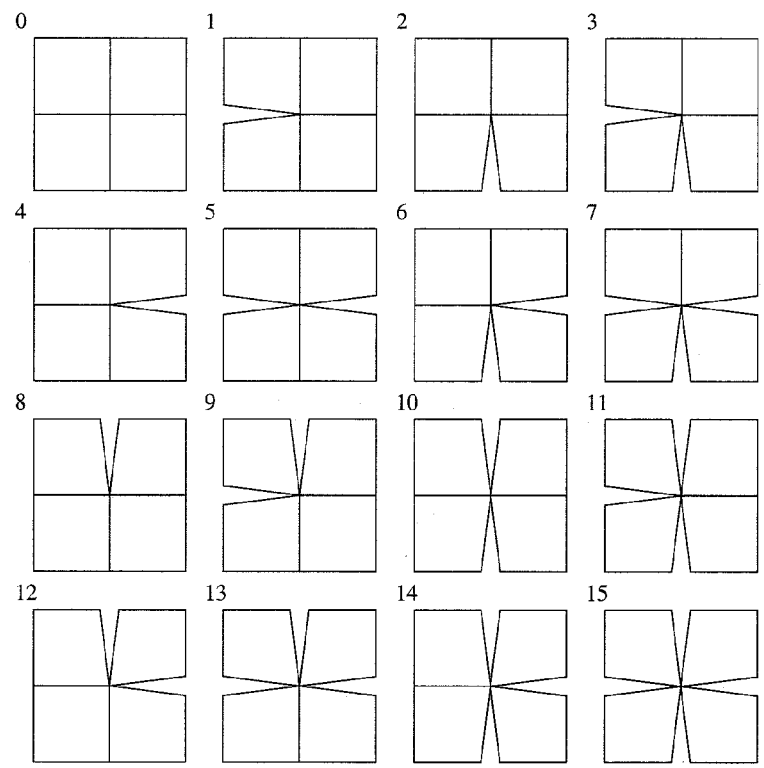
FIG. 13 shows the 16 possible cases.

The topology is therefore a corrected node by node by "splitting" the mesh (that is some nodes are duplicated in order to remove the presence of non-manifold zones). For each node, the 4 incident edges are tested and a code representing the type of disconnection around this node is calculated (1 is added if the first edge is a fault, 2 for the second, 4 for the third and 8 for the fourth). The code that is obtained ranges between 0 and 15 (FIG. 13). An edge is a fault when at least one end thereof is disconnected or one of its incident cells is deactivated.

The split cases are grouped into 5 categories with each one being associated with a specific procedure:

In cases 0, 1, 2, 4 and 8 nothing is done.
In cases 3, 6, 9 and 12: a split_3_1 is performed.
In cases 5 and 10: a split_2_2 is performed.
In cases 7, 11, 13 and 14: a split_2_1_1 is performed.
In case 15: a split_1_1_1_1 is performed.

v0 is the identifier of the current vertex seen from the first incident face and v1, v2 and v3 are the identifiers seen from the second, third and fourth faces.

Split_3_1: except for a rotation, v0=v1=v2.
If v0=v3, v3 is duplicated.
Split_2_2: except for a rotation, v0=v1 and v2=v3.
If v0=v2, v2 and v3 are duplicated.
Split_2_1_1: except for a rotation, v0=v1.
If v0=v2 or v3=v2, v2 is duplicated.
If v0=v3 or v2=v3, v3 is duplicated.
Split_1_1_1_1: if v0=v1 or v2=v1 or v3=v1, v1 is duplicated.
If v0=v2 or v1=v2 or v3=v2, v2 is duplicated.
If v0=v3 or v1=v3 or v1=v3, v3 is duplicated.

The vertex duplication procedure should perform an effective duplication only if the vertex identifier corresponds to an active cell.

In order to keep the explicit information contained in the stratigraphic mesh, for each node split, a reference to the corresponding node of the mesh is stored. This datum allows matching the sides of the fault during unfolding.

Construction of the Triangulated Surface

Figure 14:
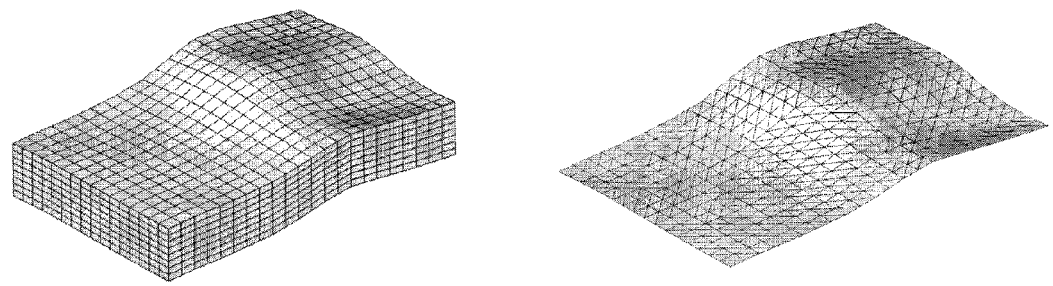
FIG. 14 illustrates the result of the extraction of a surface from a stratigraphic grid.

The triangles are constructed from the face matrix that is generated. Each quadrilateral is therefore split into two parts along its diagonal. Zero-size edges are unwanted and if the edge added is below a given threshold, the second diagonal is selected. Similarly, if this splitting leads to the formation of too small a triangle (incident to too small an edge), the corresponding point is removed. These removals are taken into account and documented because they lead to bad matching between the 3D grid and the triangulated surface, which has to be stored in the rest of the process. FIG. 14 illustrates the result of the extraction of a surface of a stratigraphic grid.

3—Setting a Depositional Position of the Well Trajectory

In this stage, the well(s) are set in depositional position by determining a position of points defining the well trajectory at the time of the deposition of the reference surface selected in stage 2.

The point is first located in the stratigraphic mesh (that is cell (i,j,k) containing the point is determined). The cell is then split into tetrahedra in order to refine the location. To refine the positioning, the tetrahedron of cell (i,j,k) containing the point to be treated is sought. The barycentric coordinates of the point in the tetrahedron are finally calculated. By means of the secondary matching structures, each point of the stratigraphic cell is associated with a point of the depositional space (it is the same for the vertices of the tetrahedra). What is referred to as the "depositional space" is the stratigraphic unit after setting the depositional position. In order to set a depositional position of the point of the well, this point just has to be replaced with the same barycentric coordinates in the corresponding tetrahedron of the depositional space.

4—Superimposition of a Regular Cartesian Grid

In this stage, a regular Cartesian grid is superimposed on the stratigraphic unit in depositional position.

Geostatistical simulations require as the input data a Cartesian grid and a set of wells (at least one) comprising properties. To supply these data, a regular grid is constructed from the stratigraphic unit and the wells in depositional position with respect to at least one reference surface. This Cartesian grid involves the depositional space with the dimension of the grid cells being calculated along x and y as a function of the average size of the cells of the depositional space along these axes. The height of the cells is calculated as a function of the number of layers of equal height along z desired and selected by the user.

To minimize the number of cells of the Cartesian grid, it is oriented as a function of the position of the depositional space (and not parallel to axes x and y).

The depositional space and the Cartesian grid are located in the same reference frame and the geometrical coordinates of the well trajectories remain unchanged.

5—Filling of the Regular Cartesian Grid Through Geostatistical Simulation

In this stage, a value of the property characteristic of the formation is assigned to each grid cell, from the well measurement, the well in depositional position and a geostatistical simulation.

The principle of geostatistical simulation on a Cartesian grid is well known and discussed hereafter.

First of all, from static data (logs, measurements on samples taken in wells, seismic data, etc.), a random function characterized by its covariance function (or similarly by its variogram), its variance and its mean, is defined, Then a set of random numbers drawn independently of one another is defined which can be, for example, a Gaussian white noise or repdigits. There is therefore one independent random number per cell and per realization, Finally, from a selected geostatistical simulator and the set of random numbers, a random draw is performed in the random function, giving access to a (continuous or discrete) realization representing a possible image of the formation. Conventionally, the random draw is achieved in a hierarchical context. The geological model is first randomly populated by a realization of the random function associated with the facies, conditionally to the punctual facies measurements. The porosity is then randomly generated on each facies, conditionally to the porosity data obtained on the facies considered. The horizontal permeability is then simulated according to its associated random function, conditionally to the facies and the porosities previously drawn, and to the permeability measurements performed in the field. Finally, the geological model is populated by a random realization of the vertical permeability conditionally to all the previous simulations and to the punctually obtained permeability data.

6—Transferring the Properties from the Cartesian Grid to the Stratigraphic Mesh

In this stage, the values assigned to the grid cells are transferred to the cells of the stratigraphic mesh.

In the depositional space, the regular Cartesian grid is constructed (stage 4) in such a way that the size of the cells corresponds to the average size of the cells of the initial stratigraphic mesh (prior to setting in depositional position). Thus, both meshes have, on average, cells of equal size. Transferring to the stratigraphic mesh the properties calculated in the depositional space (on the Cartesian grid), for each cell of the stratigraphic mesh, is performed as follows: calculating depositional position C' of the center of cell C is achieved by taking the barycenter of the depositional positions (calculated in stage 2) of the eight nodes of the cell.

In general, the depositional positions of the nodes of the stratigraphic mesh serve as interpolation bases for shifting from the space defined by the stratigraphic mesh to the depositional space and for calculating the overall dimensions (the bounding box of the Cartesian grid used for simulations in the depositional space).

The property of the cell of the stratigraphic mesh in question is that of the cell of the Cartesian grid containing C' (located simply by applying the rule of three because the mesh is a regular Cartesian grid).

The invention is thus implemented by with a computer. Indeed, the next stages are carried out by softwares such as geomodellers for stage 1 and geostatistical simulators for stage 5. Stages 2, 3, 4 and 6 are conducted from programs specific to the invention.

On the other hand, the stage wherein at least one property characteristic of the formation is measured in one or more wells is of course carried out by tools such as logging probes, seismic acquisition devices, etc.

ADVANTAGES

The method according to the invention allows updating only part of the geological model (one stratigraphic unit) without having to estimate the properties for the entire stratigraphic mesh. Dealing with the stratigraphic units independently of one another allows implementation of the method for updating the geological model via a parallel calculation on various processors.

Figure 15A:
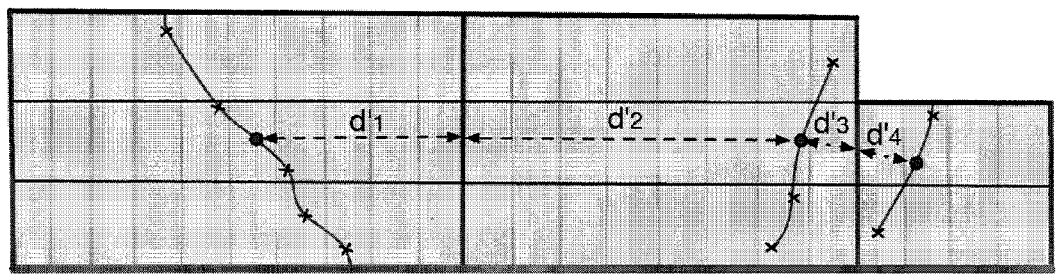
FIG. 15A illustrates a setting of a depositional position with a known method of the prior art.

Furthermore, the method provides increased precision in the estimation of distances for defining the variogram which is an essential tool for geostatistical simulations. An illustration of this advantage is described hereafter:

FIG. 15A illustrates a depositional position setting (M1) with a known method of the prior art. The number of cells is observed and the average value of the width of a cell is equal to the mean of the values of the widths of the cells of FIG. 15A. The following distances are obtained: $D_1 = d'_1 + d'_2$ and $D_2 = d'_3 + d'_4$.

Figure 15B:
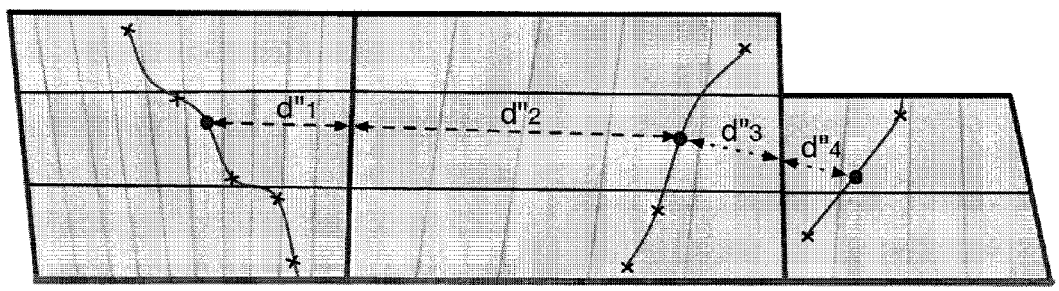
FIG. 15B illustrates a setting of a depositional position with the vertical projection method'

FIG. 15B illustrates a depositional position setting (M2) using the vertical projection method. The positions of the cell corners are projected vertically. The widths of the cells between FIG. 4 and FIG. 15B are thus identical. The following distances are obtained: $D_1 = d''_1 + d''_2$ and $D_2 = d''_3 + d''_4$.

Figure 15C:
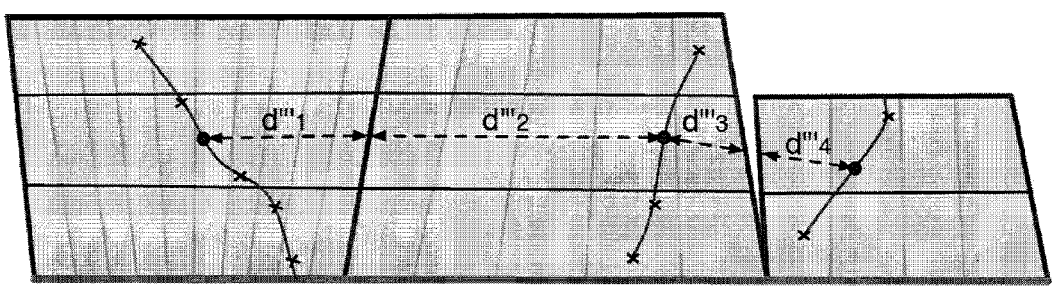
FIG. 15C illustrates a setting of a depositional position with the isometric unfolding method.

FIG. 15C illustrates a depositional position setting (M3) using the isometric unfolding method. The positions of the cell corners are entirely recalculated after flattening the reference surface. The cell widths are not identical to those of the stratigraphic mesh. The following distances are obtained: $D_1 = d'''_1 + d'''_2$ and $D_2 = d'''_3 + d'''_4$.

The table below compares distances D1 and D2 obtained after depositional position setting with the real distance calculated on the stratigraphic mesh.

|  | D1 | variation according to D1 | D2 | variation according to D2 |
| --- | --- | --- | --- | --- |
| Original grid | 630 | 0% | 270 | 0% |
| M1 | 800 | 26.9% | 150 | 55% |
| M2 | 680 | 7.9% | 250 | 7.5% |
| M3 | 650 | 3% | 260 | 3.2% |

This table highlights that the method according to the invention allows better distance estimation. This shows how important it is to use it in order to correctly analyze the variograms and to provide more reliable geostatistical estimations.

APPENDIX

Minimization of the Gaps Between Two Sets of Points

The minimization algorithm has as input data two sets of 2D points provided with a point-to-point bijection between the two sets. In practice, a 2D table of 2D points where the bijection is given by the indices of the table is sufficient. What is needed is to superimpose globally the two sets to minimize the gap between the matching points (in the sense of the bijection). The algorithm gives as output data an angle and a translation that minimize the positioning gaps in the plane between these two sets of points.

To calculate this angle and this vector, a cropping algorithm using rotation is applied to the two sets of points and then translation by minimizing the quadratic error is performed. It is a function minimization with constraints. This minimization is solved using Lagrange multipliers. The result is given in form of a table: [cos, sin, Tx, Ty].

The two surfaces are represented in form of point charts $(x_i, y_i)_{i \in I}$ and $(x'_i, y'_i)_{i \in I}$. It is desired to bring together set $(x_i, y_i)_{i \in I}$ and the other set by operator T. Here, the operator rotates an angle $\theta$ and then a translation of vector $$\begin{pmatrix} t_x \\ t_y \end{pmatrix}$$

of the surface. The goal is to minimize function F:

$$F = \sum_{i \in I} (x'_i - T(x_i))^2 + \sum_{i \in I} (y'_i - T(y_i))^2$$

by developing T:

$$F(c, s, t_x, t_y) = \sum_{i \in I} (x'_i - (t_x + cx_i - sy_i))^2 + \sum_{i \in I} (y'_i - (t_y + sx_i + cy_i))^2$$

with $\begin{cases} c = \cos(\theta) \\ s = \sin(\theta) \end{cases}$

Thus the constraint $G(c,s) = c^2 + s^2 - 1 = 0$ is obtained.

This is a function minimization with constraints. This minimization is solved using Lagrange multipliers.

The function $L(c, s, t_x, t_y, \lambda) = F(c, s, t_x, t_y) - \lambda G(c, s)$ is introduced.

The point where the differential of L is zero is sought, that is:

$$\begin{cases} (1) \frac{\partial L}{\partial t_x} = 0 \\ (2) \frac{\partial L}{\partial t_y} = 0 \\ (3) \frac{\partial L}{\partial c} = 0 \\ (4) \frac{\partial L}{\partial s} = 0 \\ (5) \frac{\partial L}{\partial \lambda} = 0 \end{cases}$$

The invention claimed is:

1. A method for constructing an image of an underground formation traversed by at least one well, the image comprising a stratigraphic mesh including a plurality of stratigraphic units defined by an upper surface and a lower surface, and representing a homogeneous sedimentary layer, the stratigraphic units including a set of cells with each cell being defined by a set of nodes wherein at least one property characteristic of the formation is measured at the level of the well, comprising for each stratigraphic unit:
   i. setting a depositional position of the stratigraphic unit, by using a computer to determine a position of cell nodes of the stratigraphic unit at a time of deposition of at least one reference surface contained in the stratigraphic unit, by:
      a. performing an isometric unfolding of at least the reference surface;
      b. defining a rotation and a translation to be applied to the at least one unfolded surface by a minimization of distances between a set of points of the at least one reference surface and corresponding points in an unfolded surface, and applying the rotation and the translation to the at least one unfolded surface to obtain a superimposition of the at least one unfolded surface with the at least one reference surface; and
      c. using the superimposition to achieve visual control of setting of the depositional position and then applying an identical unfolding within the stratigraphic unit;
   ii. superimposing with a computer a regular Cartesian grid on the stratigraphic unit in the depositional position;
   iii. assigning with a computer a value of the at least one property characteristic of the formation to each cell of the grid, from the well measurement, a well in the depositional position and a geostatistical simulation; and
   iv. transferring with a computer the values assigned to each cell of the grid to cells of the stratigraphic mesh.

2. A method as claimed in claim 1, wherein:
   the set of points of the at least one reference surface is selected by selecting vertices of the at least one reference surface with each vertex being neither on a fault fault nor in an eroded region.

3. A method as claimed in claim 1, wherein:
   the at least one unfolded reference surface is positioned in a three-dimensional space by calculating an average depth of a set of vertices of the at least one reference surface and by assigning to the set of vertices of the at least one unfolded surface the average depth.

4. A method as claimed in claim 2, wherein:
   the at least one unfolded reference surface is positioned in a three-dimensional space by calculating an average depth of a set of vertices of the at least one reference surface and by assigning to the set of vertices of the at least one unfolded surface the average depth.

5. A method as claimed in claim 1, wherein:
setting a depositional position of the stratigraphic unit is achieved by an isometric unfolding of two reference surfaces, followed by a calibration of each unfolded surface with respect to a corresponding reference surface and by a second calibration through rotation and translation of the two unfolded reference surfaces with respect to one another, and a proportional unfolding of surfaces contained between the two reference surfaces.

6. A method as claimed in claim 2, wherein:
setting a depositional position of the stratigraphic unit is achieved by an isometric unfolding of two reference surfaces, followed by a calibration of each unfolded surface with respect to a corresponding reference surface and by a second calibration through rotation and translation of the two unfolded reference surfaces with respect to one another, and a proportional unfolding of surfaces contained between the two reference surfaces.

7. A method as claimed in claim 3, wherein:
setting a depositional position of the stratigraphic unit is achieved by an isometric unfolding of two reference surfaces, followed by a calibration of each unfolded surface with respect to a corresponding reference surface and by a second calibration through rotation and translation of the two unfolded reference surfaces with respect to one another, and a proportional unfolding of surfaces contained between the two reference surfaces.

8. A method as claimed in claim 4, wherein:
setting a depositional position of the stratigraphic unit is achieved by an isometric unfolding of two reference surfaces, followed by a calibration of each unfolded surface with respect to a corresponding reference surface and by a second calibration through rotation and translation of the two unfolded reference surfaces with respect to one another, and a proportional unfolding of surfaces contained between the two reference surfaces.

9. A method as claimed in claim 5, wherein:
the two reference surfaces correspond to the upper surface and the lower surface.

10. A method as claimed in claim 6, wherein:
the two reference surfaces correspond to the upper surface and the lower surface.

11. A method as claimed in claim 7, wherein:
the two reference surfaces correspond to the upper surface and the lower surface.

12. A method as claimed in claim 8, wherein:
the two reference surfaces correspond to the upper surface and the lower surface.

13. A method as claimed in claim 5, wherein:
the second calibration is performed by defining rotation and translation to be applied to a first unfolded surface by a minimization of distances between a set of points of the first unfolded surface and corresponding points in a second unfolded surface, and the rotation and the translation are applied to the first unfolded surface to obtain a superimposition of the unfolded surfaces.

14. A method as claimed in claim 6, wherein:
the second calibration is performed by defining rotation and translation to be applied to a first unfolded surface by a minimization of distances between a set of points of the first unfolded surface and corresponding points in a second unfolded surface, and the rotation and the translation are applied to the first unfolded surface to obtain a superimposition of the unfolded surfaces.

15. A method as claimed in claim 7, wherein:
the second calibration is performed by defining rotation and translation to be applied to a first unfolded surface by a minimization of distances between a set of points of the first unfolded surface and corresponding points in a second unfolded surface, and the rotation and the translation are applied to the first unfolded surface to obtain a superimposition of the unfolded surfaces.

16. A method as claimed in claim 8, wherein:
the second calibration is performed by defining rotation and translation to be applied to a first unfolded surface by a minimization of distances between a set of points of the first unfolded surface and corresponding points in a second unfolded surface, and the rotation and the translation are applied to the first unfolded surface to obtain a superimposition of the unfolded surfaces.

17. A method as claimed in claim 9, wherein:
the second calibration is performed by defining rotation and translation to be applied to a first unfolded surface by a minimization of distances between a set of points of the first unfolded surface and corresponding points in a second unfolded surface, and the rotation and the translation are applied to the first unfolded surface to obtain a superimposition of the unfolded surfaces.

18. A method as claimed in claim 10, wherein:
the second calibration is performed by defining rotation and translation to be applied to a first unfolded surface by a minimization of distances between a set of points of the first unfolded surface and corresponding points in a second unfolded surface, and the rotation and the translation are applied to the first unfolded surface to obtain a superimposition of the unfolded surfaces.

19. A method as claimed in claim 11, wherein:
the second calibration is performed by defining rotation and translation to be applied to a first unfolded surface by a minimization of distances between a set of points of the first unfolded surface and corresponding points in a second unfolded surface, and the rotation and the translation are applied to the first unfolded surface to obtain a superimposition of the unfolded surfaces.

20. A method as claimed in claim 12, wherein:
the second calibration is performed by defining rotation and translation to be applied to a first unfolded surface by a minimization of distances between a set of points of the first unfolded surface and corresponding points in a second unfolded surface, and the rotation and the translation are applied to the first unfolded surface to obtain a superimposition of the unfolded surfaces.

21. A method as claimed in claim 1, wherein:
an isometric unfolding is performed by accounting for faults of the formation and by carrying out a fault side closure.

22. A method as claimed in claim 2, wherein:
an isometric unfolding is performed by accounting for faults of the formation and by carrying out a fault side closure.

23. A method as claimed in claim 3, wherein:
an isometric unfolding is performed by accounting for faults of the formation and by carrying out a fault side closure.

24. A method as claimed in claim 4, wherein:
an isometric unfolding is performed by accounting for faults of the formation and by carrying out a fault side closure.

25. A method as claimed in claim 5, wherein:
an isometric unfolding is performed by accounting for faults of the formation and by carrying out a fault side closure.

26. A method as claimed in claim 6, wherein:
an isometric unfolding is performed by accounting for faults of the formation and by carrying out a fault side closure.

27. A method as claimed in claim 7, wherein:
an isometric unfolding is performed by accounting for faults of the formation and by carrying out a fault side closure.

28. A method as claimed in claim 8, wherein:
an isometric unfolding is performed by accounting for faults of the formation and by carrying out a fault side closure.

29. A method as claimed in claim 9, wherein:
an isometric unfolding is performed by accounting for faults of the formation and by carrying out a fault side closure.

30. A method as claimed in claim 10, wherein:
an isometric unfolding is performed by accounting for faults of the formation and by carrying out a fault side closure.

31. A method as claimed in claim 11, wherein:
an isometric unfolding is performed by accounting for faults of the formation and by carrying out a fault side closure.

32. A method as claimed in claim 12, wherein:
an isometric unfolding is performed by accounting for faults of the formation and by carrying out a fault side closure.

33. A method as claimed in claim 13, wherein:
an isometric unfolding is performed by accounting for faults of the formation and by carrying out a fault side closure.

34. A method as claimed in claim 14, wherein:
an isometric unfolding is performed by accounting for faults of the formation and by carrying out a fault side closure.

35. A method as claimed in claim 15, wherein:
an isometric unfolding is performed by accounting for faults of the formation and by carrying out a fault side closure.

36. A method as claimed in claim 16, wherein:
an isometric unfolding is performed by accounting for faults of the formation and by carrying out a fault side closure.

37. A method as claimed in claim 17, wherein:
an isometric unfolding is performed by accounting for faults of the formation and by carrying out a fault side closure.

38. A method as claimed in claim 18, wherein:
an isometric unfolding is performed by accounting for faults of the formation and by carrying out a fault side closure.

39. A method as claimed in claim 19, wherein:
an isometric unfolding is performed by accounting for faults of the formation and by carrying out a fault side closure.

40. A method as claimed in claim 20, wherein:
an isometric unfolding is performed by accounting for faults of the formation and by carrying out a fault side closure.

41. A method as claimed in claim 1, wherein:
the surfaces are triangular surfaces.

42. A method as claimed in claim 2, wherein: the surfaces are triangular surfaces.

43. A method as claimed in claim 3, wherein:
the surfaces are triangular surfaces.

44. A method as claimed in claim 5, wherein:
the surfaces are triangular surfaces.

45. A method as claimed in claim 9, wherein:
the surfaces are triangular surfaces.

46. A method as claimed in claim 13, wherein:
the surfaces are triangular surfaces.

47. A method as claimed in claim 21, wherein:
the surfaces are triangular surfaces.

* * * * *